(12) United States Patent
Yueh et al.

(10) Patent No.: US 12,253,237 B2
(45) Date of Patent: Mar. 18, 2025

(54) LIGHT EMITTING DEVICE

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/664,311

(22) Filed: May 15, 2024

(65) Prior Publication Data

US 2024/0302027 A1 Sep. 12, 2024

Related U.S. Application Data

(63) Continuation of application No. 17/548,596, filed on Dec. 13, 2021, now Pat. No. 12,018,816, which is a continuation of application No. 17/213,239, filed on Mar. 26, 2021, now Pat. No. 11,221,126.

(30) Foreign Application Priority Data

Apr. 26, 2020 (CN) .......................... 202010338925.2

(51) Int. Cl.
*F21V 14/00* (2018.01)
*H01L 25/075* (2006.01)
*H01L 33/58* (2010.01)
*G02F 1/1334* (2006.01)

(52) U.S. Cl.
CPC ........ *F21V 14/003* (2013.01); *H01L 25/0753* (2013.01); *H01L 33/58* (2013.01); *G02F 1/1334* (2013.01)

(58) Field of Classification Search
CPC .................................................... F21V 14/003
See application file for complete search history.

(56) References Cited

U.S. PATENT DOCUMENTS

2017/0089547 A1* 3/2017 Ollila .................... F21V 17/101

* cited by examiner

*Primary Examiner* — Sean P Gramling
(74) *Attorney, Agent, or Firm* — Winston Hsu

(57) ABSTRACT

A light emitting device includes a plurality of light emitting elements and a light controller. The light emitting elements emit lights. The light controller is disposed on the light emitting elements for the lights passing through to form output lights. The light controller includes a first optical element, a second optical element and a transparent element disposed between the first optical element and the second optical element, and a thickness of the transparent element is not greater than 0.35 mm.

15 Claims, 11 Drawing Sheets

LIGHT EMITTING DEVICE

CROSS REFERENCE TO RELATED APPLICATIONS

This application is a continuation application of U.S. application Ser. No. 17/548,596, filed on Dec. 13, 2021, which is a continuation application of U.S. application Ser. No. 17/213,239, filed on Mar. 26, 2021. The contents of these applications are incorporated herein by reference.

BACKGROUND OF THE DISCLOSURE

1. Field of the Disclosure

The present disclosure relates to a light emitting device, and more particularly to a light emitting device which can control or change direction of light.

2. Description of the Prior Art

As the evolution and development of electronic devices, the electronic devices have become an indispensable item. The electronic devices such as display devices or light emitting devices can provide more convenient information transmission or image display. However, as the users attach importance to privacy when viewing these devices, or as the safety requirements to prevent specific persons from viewing these devices are increased (e.g., prevent the driver from watching the display device or the light emitting device of the car while driving, or prevent the lights emitted by the display device or the light emitting device of the car from being projected on the windshield to interfere with the driver), these devices need to have the function of controlling the direction of light.

SUMMARY OF THE DISCLOSURE

According to an embodiment, the present disclosure provides a light emitting device including a plurality of light emitting elements and a light controller. The light emitting elements emit lights. The light controller is disposed on the light emitting elements for the lights passing through to form output lights. The light controller includes a first optical element, a second optical element and a transparent element disposed between the first optical element and the second optical element, and a thickness of the transparent element is not greater than 0.35 mm.

DETAILED DESCRIPTION

Figure 1:
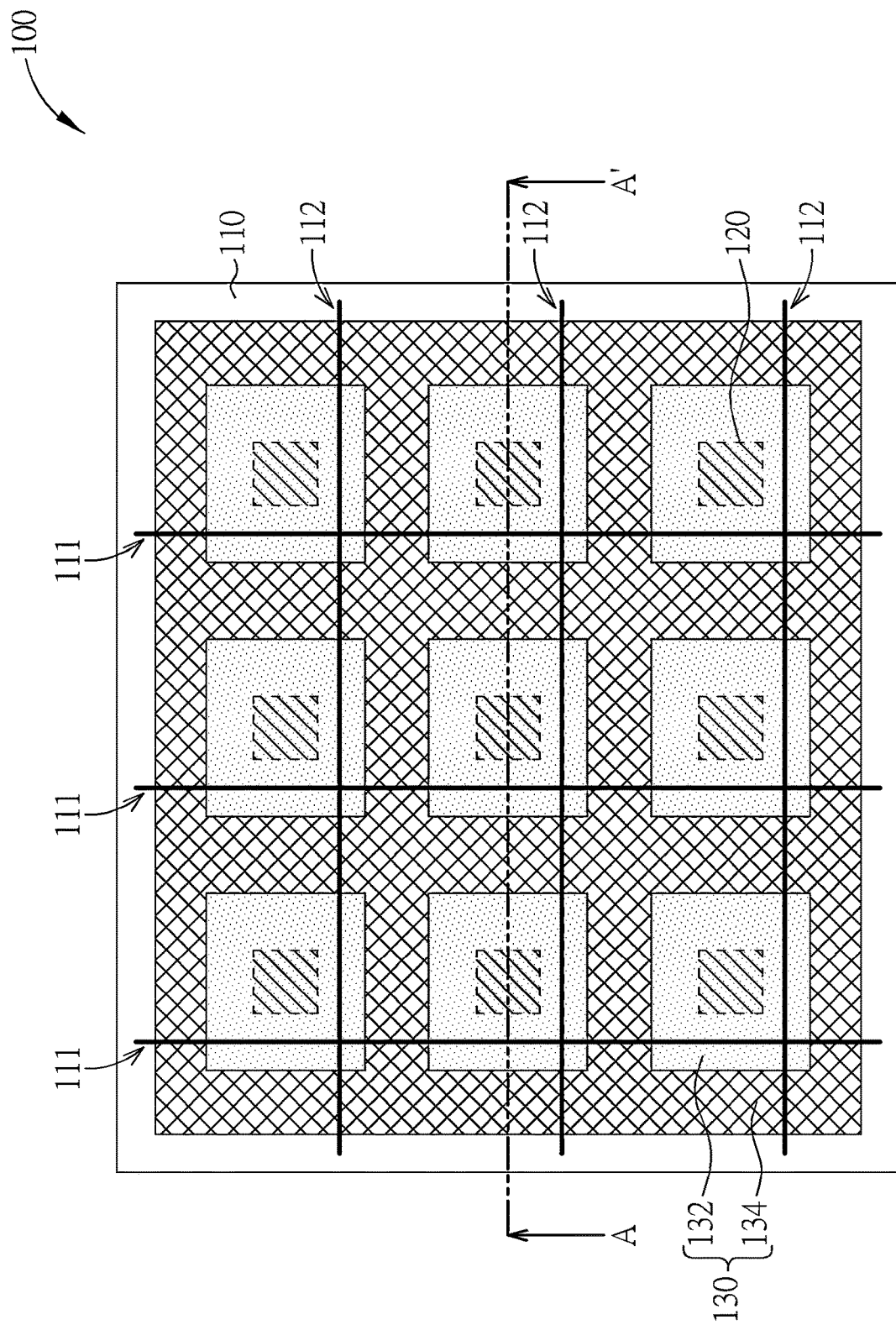
FIG. 1 is a schematic diagram showing a top view of a light emitting device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of a light emitting device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, drawings the show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component (s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view/vertical direction, the corresponding component may be below or above the another component, and the disposition relationship along the top-view/vertical direction are determined by an orientation of the device.

It will be understood that when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the light emitting device may optionally include a display function, a sensing function, a touch sensing function, an antenna function, other suitable function or a combination thereof, but not limited thereto. In some embodiments, the light emitting device may include a tiled device, but not limited thereto. The light emitting device may include liquid crystal (LC) molecules, an organic light-emitting diode (OLED), an inorganic light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. Moreover, the light emitting device may include a color light emitting device or a monochrome light emitting device, and a shape of the light emitting device may be a rectangle, a circle, a polygon, a shape having a curved edge or other suitable shape, but not limited thereto. In the following, in order to explain exemplarily, the light emitting device is a color light emitting device having light-emitting diodes (e.g., organic light-emitting diodes, inorganic light-emitting diodes or quantum-dot light-emitting diodes) as an example, but the light emitting device is not limited thereto. In some embodiments, the light emitting device may include a liquid crystal panel or be other suitable light emitting device.

Figure 2:
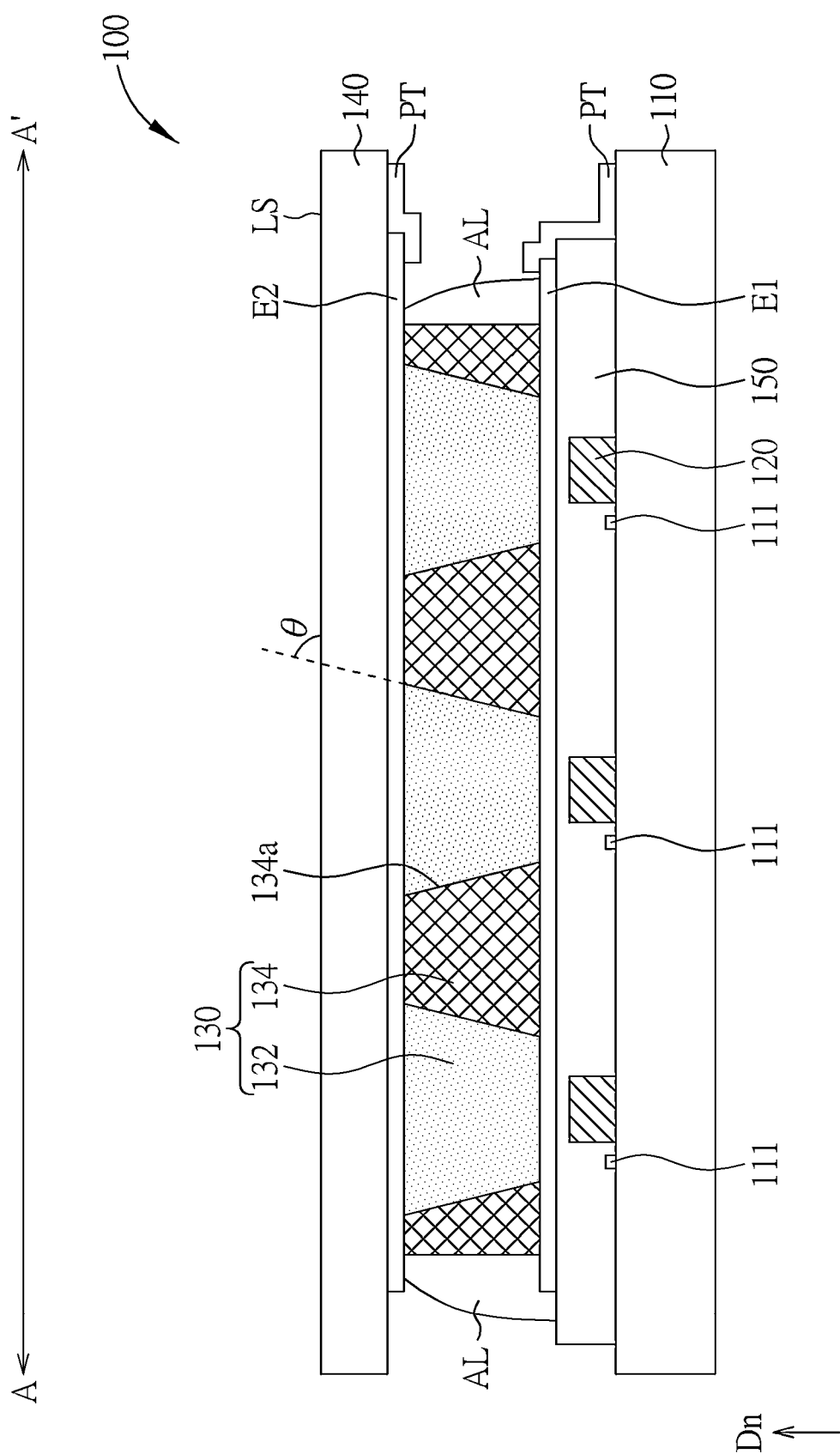
FIG. 2 is a schematic diagram showing a cross-sectional view of the light emitting device taken along a cross-sectional line A-A' in FIG. 1.

Referring to FIG. 1 and FIG. 2, FIG. 1 is a schematic diagram showing a top view of a light emitting device according to a first embodiment of the present disclosure, FIG. 2 is a schematic diagram showing a cross-sectional view of the light emitting device taken along a cross-sectional line A-A' in FIG. 1. As shown in FIG. 1 and FIG. 2, the light emitting device 100 of this embodiment includes a first substrate 110, a plurality of light emitting elements 120, a light controller 130, a first control electrode E1 and a second control electrode E2, and the light emitting device 100 may optionally include a second substrate 140. Each structure and each component will be described as below. FIG. 1 only shows nine light emitting elements 120 as an example, but the light emitting device 100 may include fewer or more light emitting elements 120 in fact. The first substrate 110 may be disposed opposite to the second substrate 140, and the light emitting elements 120, the light controller 130, the first control electrode E1 and the second control electrode E2 may be disposed between the first substrate 110 and the second substrate 140. The first substrate 110 and the second substrate 140 may individually include glass, quartz, sapphire, polyimide (PI), polyethylene terephthalate (PET), other suitable material or a combination thereof, so as to be a rigid substrate or a flexible substrate, but not limited thereto. The material of the first substrate 110 and the material of the second substrate 140 may be the same or different. Note that the light emitting device 100 has an illuminating surface LS, the illuminating surface LS is an outermost surface which the light provided from the light emitting device 100 passes through. For example, in the embodiment shown in FIG. 2, the illuminating surface LS may be an outer surface of the second substrate 140, but not limited thereto.

In FIG. 2, the light emitting elements 120 may be disposed on the first substrate 110, and may be configured to emit lights. Note that, in the lights generated by the light emitting elements 120, the present disclosure only discusses the lights emitted towards the illuminating surface LS, wherein the emitted direction of the light emitted towards the illuminating surface LS has a positive component parallel to a upward normal direction Dn of the first substrate 110 (hereafter, referred as the normal direction Dn), and the lights emitted towards the illuminating surface LS may be lights directly emitted from the light emitting elements 120 and/or reflected lights emitted from the light emitting elements 120 and reflected by other component (s). In the present disclosure, the light emitting element 120 may generate the light with the intensity corresponding to the signal (e.g., gray level signal). For instance, if the light emitting device 100 is configured to display an image, each light emitting element 120 may generate the light with the intensity corresponding to the gray level signal of the image. In some embodiments, the light emitting element 120 may be a self-luminous type component, such as an organic light-emitting diode, an inorganic light-emitting diode (e.g., micro-LED and/or a mini-LED) or a quantum-dot light-emitting diode, but not limited thereto. In some embodiments, the light emitting element 120 may be corresponding to a sub-pixel in a liquid crystal panel. Thus, the light emitting element 120 may adjust the liquid crystal molecules in the light emitting element 120 according to the gray level signal of the image, such that the transmittance of the backlight may be adjusted, and the light emitting element 120 may generate the light with the intensity corresponding to the gray level signal of the image, but not limited thereto. Note that, if the light emitting element 120 is the sub-pixel in the liquid crystal panel, the first substrate 110 of the light emitting device 100 may be a substrate having a driving circuit configured to drive the liquid crystal molecules in the liquid crystal panel.

In some embodiments, the light emitting elements 120 may generate the lights with a plurality of colors. For example, the light emitting elements 120 may include at least one first light emitting element emitting red light, at least one second light emitting element emitting green light and at least one third light emitting element emitting blue light, such that the light emitting device 100 may generate colored light to be a colored light emitting device, but not limited thereto. For another example, the light emitting elements 120 may emit red light, green light, blue light and yellow light, but not limited thereto. In some embodiments, all of the light emitting elements 120 may emit the same color light, and the light emitting device 100 may further include a light converting layer disposed on the light emitting element 120, so as to convert (or filter) the light emitted from the light emitting element 120 into another light with different color, wherein the light converting layer may be disposed at any suitable position between the illuminating surface LS and the light emitting element 120. The light converting layer may include color filter, quantum dots (QD) material, fluorescence material, phosphorescence material, other suitable material or a combination thereof. For instance, the light emitting elements 120 may emit white light, and the light converting layer may include a first light converting part converting the white light into the red light, a second light converting part converting the white light into the green light and a third light converting part converting the white light into the blue light, such that the light emitting device 100 may generate colored light to be a colored light emitting device, but not limited thereto. For another example, the light emitting elements 120 may emit blue light, and the light converting layer may include a first light converting part converting the blue light into the red light and a second light converting part converting the blue light into the green light, such that the light emitting device 100 may generate colored light to be a colored light emitting device, but not limited thereto. In some embodiments, all of the light emitting elements 120 may emit the same color light, such that the light emitting device 100 may be a monochrome light emitting device, but not limited thereto.

Moreover, the light emitting device 100 may further include at least one switching component (not shown in figures), and each switching component may be electrically connected to one or more light emitting element(s) 120, or electrically connected to one or more component(s) in the light emitting element(s) 120, wherein the light emitting element 120 may change the intensity of its emitting light according to the switching state of the switching component which it is electrically connected. In some embodiments, the switching component may be a thin film transistor (TFT) or other suitable switch, wherein the thin film transistor may be such as a top gate thin film transistor, a bottom gate thin film transistor, a dual gate thin film transistor or other suitable transistor.

The light emitting device 100 may further include a plurality of conductive lines to be electrically connected to the electronic component(s) in the light emitting device 100. In some embodiments, the conductive lines may include a plurality of first conductive lines 111 and a plurality of second conductive lines 112 disposed on the first substrate 110. Each first conductive line 111 may be electrically connected to or coupled to such as the light emitting element(s) 120, the component(s) in the light emitting element(s) 120 and/or the switching component(s), and each second conductive line 112 may be electrically connected to or coupled to such as the light emitting element(s) 120, the component(s) in the light emitting element(s) 120 and/or the switching component(s). In some embodiments, the first conductive line 111 may be electrically connected between one end (e.g., a source) of the switching component and a circuit (e.g., an integrated circuit) providing the gray level signal, such that the first conductive line 111 may serve as a signal line or a data line; the second conductive line 112 may be electrically connected between another end (e.g., a gate) of the switching component and a circuit (e.g., an integrated circuit and/or a gate driving circuit) providing a switching signal, such that the second conductive line 112 may serve as a scan line, but not limited thereto. The connection of the conductive line may be adjusted based on the circuit design. Accordingly, in one of the light emitting elements 120, if the switching component is turned on based on the switching signal, the light emitting element 120 may generate the light having the intensity corresponding to the gray level signal. In some embodiments, the first conductive line 111 and the second conductive line 112 may be a line which has slight waves and substantially extends along a direction rather than a straight line. Furthermore, in some embodiments, the first conductive lines 111 may be substantially parallel to each other, the second conductive lines 112 may be substantially parallel to each other, and the first conductive line 111 and the second conductive line 112 may not be parallel to each other. For instance, the first conductive line 111 and the second conductive line 112 may be substantially perpendicular to each other, but not limited thereto. The above only describes the first conductive lines 111 and the second conductive lines 112 as an example, but other conductive line(s) can be added based on requirement(s).

In FIG. 2, the light emitting device 100 may optionally include an insulating layer 150 disposed on the light emitting element(s) 120. In some embodiments, the insulating layer 150 may have a protecting function to protect the light emitting element(s) 120 covered by the insulating layer 150. In some embodiments, the insulating layer 150 may be further disposed on the switching component(s) and the conductive line(s), so as to protect the switching component(s) and the conductive line(s).

The forming methods of the light emitting element 120, the switching component, the conductive line and the insulating layer 150 may be adjusted based on requirement(s) and/or the type of the light emitting element 120. In some embodiments, the light emitting device 100 may include a circuit component layer disposed on the first substrate 110, wherein the circuit component layer may include a plurality of layers, and these layers may form the light emitting element 120, the switching component, the conductive line (e.g., the first conductive line 111 and/or the second conductive line 112) and the insulating layer 150. In detail, the layers in the circuit component layer may include at least one conductive layer, at least one interlayer insulating layer, at least one semiconductor layer, other suitable layer or a combination thereof. The material of the conductive layer may include metal, transparent conductive material (such as indium tin oxide (ITO), indium zinc oxide (IZO), etc.), other suitable conductive material or a combination thereof. The material of the interlayer insulating layer may include such as silicon oxide (SiO$_x$), silicon nitride silicon (SiN$_y$), oxynitride (SiO$_x$N$_y$), polymethylmetacrylate (PMMA), other suitable insulating material or a combination thereof. The material of the semiconductor layer may include such as poly-silicon, amorphous silicon, metal-oxide semiconductor (e.g., IGZO), other suitable semiconductor material or a combination thereof, but not limited thereto. These layers in the circuit component layer may be formed by at least one semiconductor process(es) such as a deposition process, an etch process and/or a photolithography. Namely, the light emitting element 120 (for example, but not limited to, the organic light-emitting diode), the switching component, the conductive line and the insulating layer 150 may be formed by the semiconductor process(es), but not limited thereto. In some embodiments, the layers in the circuit component layer may form the switching component and the conductive line, and the light emitting element 120 (for example, but not limited to, the inorganic light-emitting diode) may be disposed on the circuit component layer by a bonding process; then, the insulating layer 150 is formed on the light emitting element 120, but not limited thereto. In some embodiments, the layers in the circuit component layer may form the switching component, the conductive line and at least one component of the light emitting element 120, and other component(s) of the light emitting element 120 may be formed on the circuit component layer by other suitable method(s). For instance, if the light emitting element 120 is the sub-pixel in the liquid crystal panel, a pixel electrode of the light emitting element 120 may be included in the circuit component layer, and the liquid crystal molecules are disposed on the circuit component layer. Note that, if the light emitting element 120 is the sub-pixel in the liquid crystal panel, the insulating layer 150 may be another substrate of the liquid crystal panel, and this another substrate is opposite to the substrate having the driving circuit configured to drive the liquid crystal molecules.

The layers in the circuit component layer may be further configured to form other required electronic component(s) and/or structure(s). In some embodiments, the light emitting device 100 may further include other required active component(s) and/or passive component(s) disposed in the circuit component layer. For instance, based on requirement(s), the light emitting device 100 may further include a capacitor, and the capacitor may be electrically connected to the light emitting element 120 or the component(s) of the light emitting element 120, but not limited thereto.

As shown in FIG. 2, the light controller 130, the first control electrode E1 and the second control electrode E2 are disposed on the light emitting elements 120, wherein the first control electrode E1 and the second control electrode E2 may control the state of the light controller 130 based on the received control signal. In the different states of the light controller 130, the lights generated by the light emitting elements 120 may have different types of radiating directions after they pass through the light controller 130. In some embodiments (as shown in FIG. 2), the light controller 130 may include a plurality of switchable diffusers 132 and a plurality of light shielding elements 134, wherein the switchable diffuser 132 may be disposed corresponding to (or overlapped with) at least one of the light emitting elements 120 in the normal direction Dn, and the light shielding element 134 may be disposed between two adjacent switchable diffusers 132. Therefore, the light shielding element 134 may be not corresponding to (or not overlapped with) the light emitting element 120 in the normal direction Dn. For example, in FIG. 1 and FIG. 2, the switchable diffuser 132 may be corresponding to (or overlapped with) one light emitting element 120 in the normal direction Dn, but not limited thereto. In this embodiment, the lights generated by the light emitting elements 120 may pass through the switchable diffusers 132, and the light shielding elements 134 may shield the lights generated by the light emitting elements 120, wherein the light shielding element 134 may have a side wall 134a capable of adjusting the light path (e.g., an angle θ between the side wall 134a and the illuminating surface LS may be, but not limited to, greater than or equal to 80°). Note that the side wall 134a may substantially extend along an extending direction and not be a flatten surface, and the angle θ may be between this extending direction and the illuminating surface LS. The light shielding elements 134 may include photoresist, black ink, black resin, gray ink, gray resin, white ink, white resin, pigment, dye, other suitable light shielding material or a combination thereof. In addition, the dispositions of the switchable diffusers 132 and the light shielding elements 134 may be designed based on requirement(s). For instance, in some embodiments (as shown in FIG. 2), the light controller 130 may be a single layer structure including the switchable diffusers 132 and the light shielding elements 134, and thus, the switchable diffusers 132 and the light shielding elements 134 included in the single layer structure may be alternated arranged in a horizontal direction (the horizontal direction is perpendicular to the normal direction Dn), but not limited thereto. For instance, in some embodiments (as shown in FIG. 2), the light shielding elements 134 may surround the switchable diffusers 132 in top view, but not limited thereto. For instance, in some embodiments (as shown in FIG. 1 and FIG. 2), two adjacent switchable diffusers 132 may be completely separated by the light shielding element(s) 134, but not limited thereto. Moreover, in some embodiments (as shown in FIG. 1), in the normal direction Dn, the first conductive line 111 and the second conductive line 112 may cross over some light shielding elements 134 and some switchable diffusers 132, but not limited thereto. In some embodiments (not shown in figures), in the normal direction Dn, the first conductive line 111 and the second conductive line 112 may overlap the light shielding element(s) 134 and not overlap the switchable diffuser(s) 132, but not limited thereto.

Since the first control electrode E1 and the second control electrode E2 need to control the state of the light controller 130, the first control electrode E1 and the second control electrode E2 may be disposed adjacent to the light controller 130. In this embodiment, the first control electrode E1 and the second control electrode E2 may control the switchable diffusers 132 based on the received control signal, so as to control the state of the light controller 130. Thus, the first control electrode E1 and the second control electrode E2 may be at least adjacent to the switchable diffusers 132 of the light controller 130. In some embodiments, the state of the light controller 130 may be controlled by a voltage difference between the first control electrode E1 and the second control electrode E2 (or controlled by an electric field between the first control electrode E1 and the second control electrode E2), but not limited thereto. In some embodiments (as shown in FIG. 2), the first control electrode E1 and the second control electrode E2 of the light emitting device 100 may be disposed on two opposite sides of the light controller 130 respectively, wherein the first control electrode E1 is between the light controller 130 and the first substrate 110, the second control electrode E2 is between the light controller 130 and the second substrate 140, but not limited thereto. In some embodiments, the first control electrode E1 and the second control electrode E2 of the light emitting device 100 may be disposed on the same side of the light controller 130, but not limited thereto. In addition, the material of the first control electrode E1 and the material of the second control electrode E2 may individually include metal, transparent conductive material (such as indium tin oxide (ITO), indium zinc oxide (IZO), etc.), other suitable conductive material or a combination thereof. In this embodiment, since the lights generated by the light emitting elements 120 may pass through the switchable diffusers 132, a portion of the first control electrode E1 and a portion of the second control electrode E2 corresponding to the switchable diffusers 132 have high transparency, and no restrictions on other portion of the first control electrode E1 and other portion of the second control electrode E2. For example, in some embodiments, the material of the portion of the first control electrode E1 and the material of the portion of the second control electrode E2 corresponding to the switchable diffusers 132 may be transparent conductive material, and the material of other portion of the first control electrode E1 and the material of other portion of the second control electrode E2 may be metal to reduce the resistance of these control electrodes; in some embodiments, the first control electrode E1 and the second control electrode E2 may be respectively transparent conductive layers to reduce the manufacturing cost, but not limited thereto. In some embodiments, the first control electrode E1 and the second control electrode E2 may be patterned, but not limited thereto. Moreover, the light emitting device 100 may further include a plurality of peripheral traces PT, the circuit (e.g., an integrated circuit) providing the control signal may be electrically connected to the first control electrode E1 and the second control electrode E2 by the peripheral traces PT respectively. The peripheral traces PT may include any suitable conductive material, such as metal, but not limited thereto.

Figure 3:
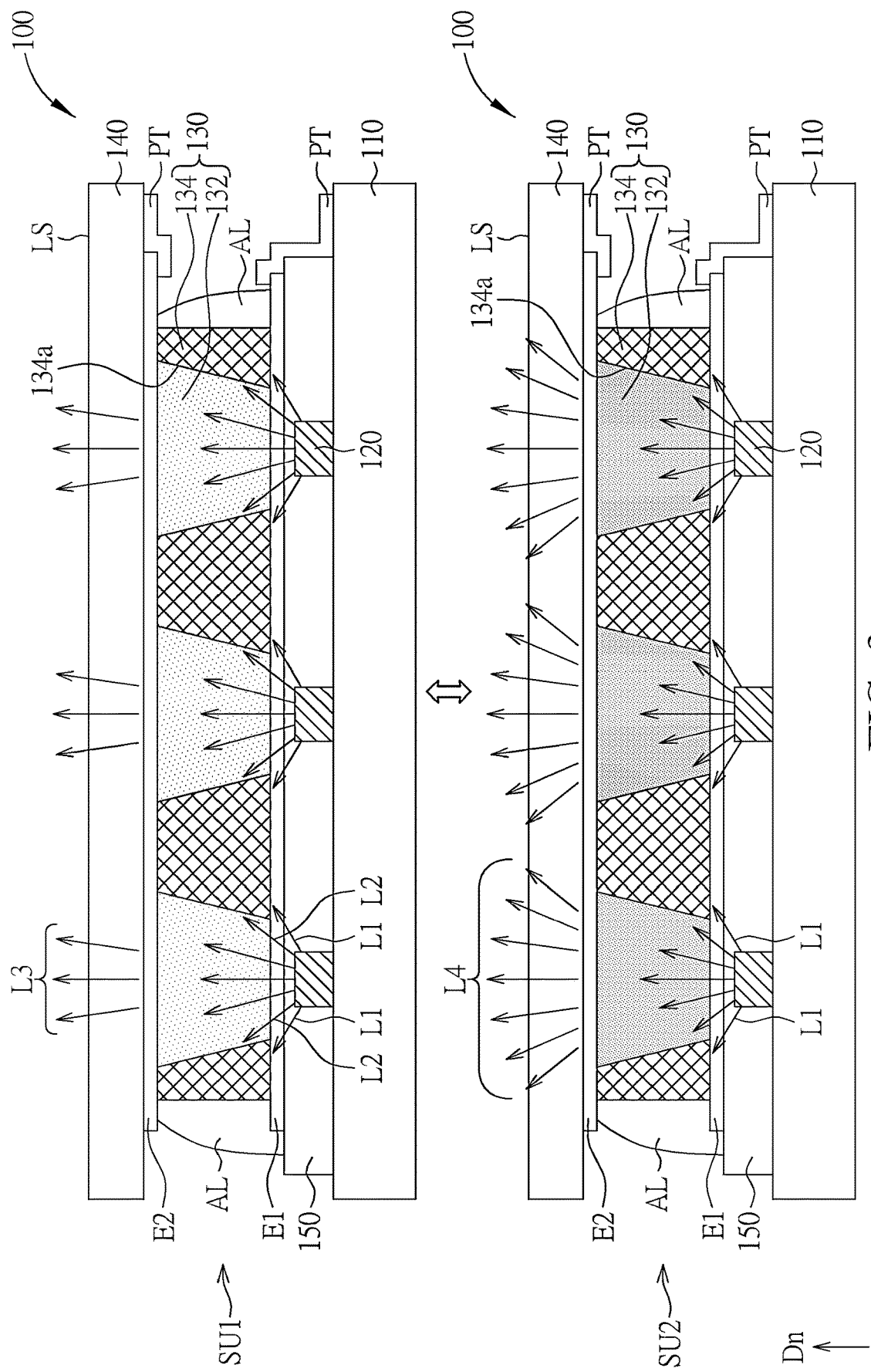
FIG. 3 is a schematic diagram showing a cross-sectional view of a structure and lights of the light emitting device in a first state and a structure and lights of the light emitting device in a second state according to the first embodiment of the present disclosure.
Figure 4:
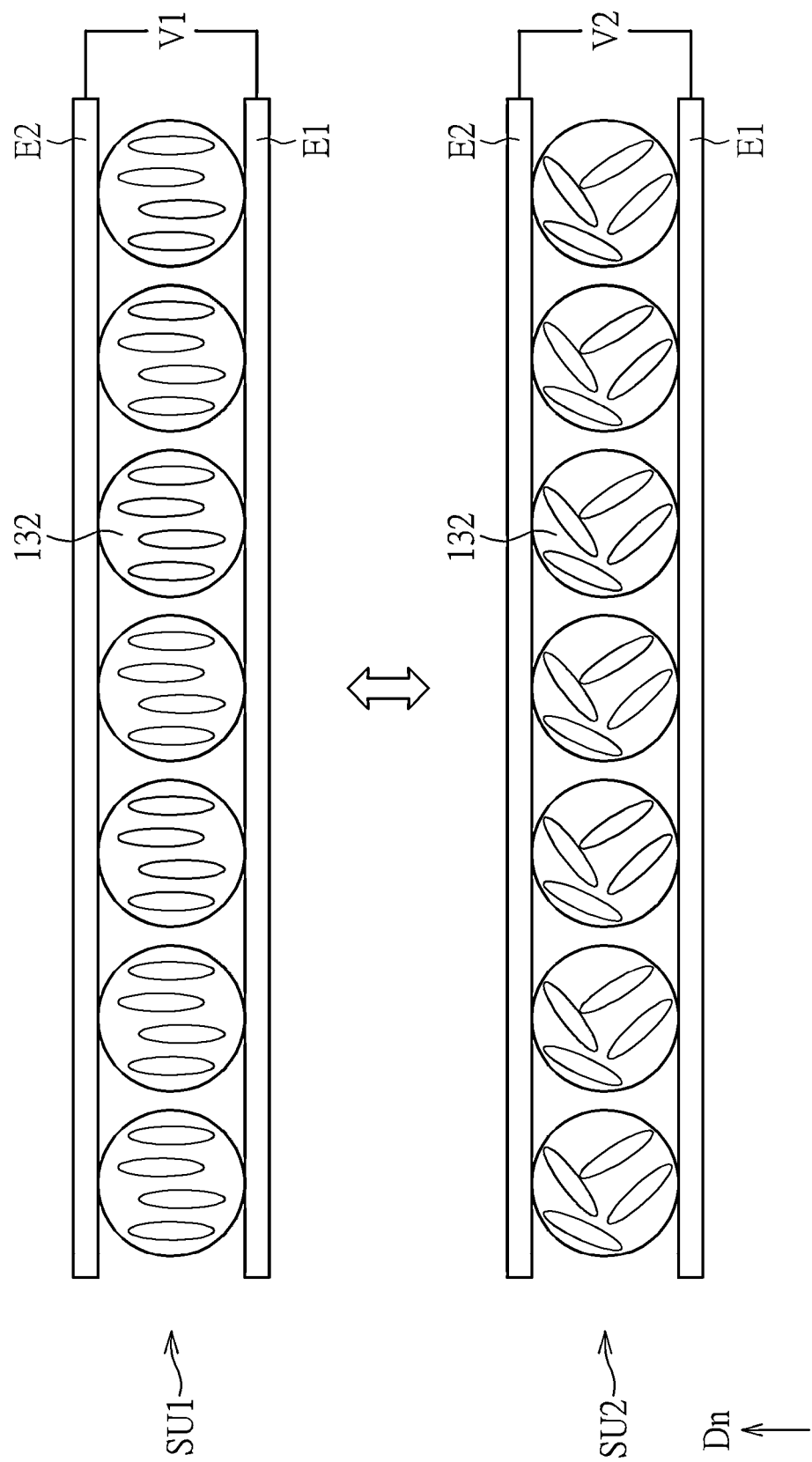
FIG. 4 is a schematic diagram showing a light controller in a first state and a light controller in a second state according to the first embodiment of the present disclosure.

Referring to FIG. 3 and FIG. 4, FIG. 3 is a schematic diagram showing a cross-sectional view of a structure and lights of the light emitting device in a first state and a structure and lights of the light emitting device in a second state according to the first embodiment of the present disclosure, FIG. 4 is a schematic diagram showing a light controller in a first state and a light controller in a second state according to the first embodiment of the present disclosure, wherein the first conductive line and the second conductive line are omitted in FIG. 3 to make FIG. 3 clear. Note that FIG. 3 uses different shadings to show the switchable diffusers 132 in different states, wherein the switchable diffusers 132 in a first state SU1 are shown by sparsely dotted shading, and the switchable diffusers 132 in a second state SU2 are shown by densely dotted shading. Note that FIG. 4 only shows the first control electrode E1, the second control electrode E2 and the switchable diffusers 132 to make FIG. 4 clear. As shown in FIG. 3, regarding the operation of the light controller 130, the light controller 130 may be switched between the first state SU1 and the second state SU2 according to the control signals received by the first control electrode E1 and the second control electrode E2, wherein the light controller 130 may collimate the lights generated by the light emitting elements 120 in the first state SU1, and the light controller 130 may diffuse the lights generated by the light emitting elements 120 in the second state SU2. Note that, in the present disclosure, the collimation and the diffusion of the lights may be confirmed by measuring output lights passing through the illuminating surface LS (the lights generated by the light emitting elements 120 are referred as the output lights after passing through the illuminating surface LS). The collimated lights mean that the sum of the intensity of the output lights of which the angle with the illuminating surface LS ranges from 80° to 100° is greater than or equal to 80% of the total intensity of the output lights. That is to say, when the sum of the intensity of the output lights of which the angle with the normal direction of the illuminating surface LS ranges from −10° to +10° is greater than or equal to 80% of the sum of the intensity of the output lights with all angles (i.e., the angle with the normal direction of the illuminating surface LS ranges from −90° to +90°), the output lights are collimated. The diffused lights mean that the intensity of the output lights within the observable viewing angle of the light emitting device 100 has only a small difference without rapid changes (i.e., the output lights are substantially uniformly scattered within the observable viewing angle of the light emitting device 100, and there is no area has concentrated output lights). Thus, under the condition that the output lights are diffused, the sum of the intensity of the output lights of which the angle with the illuminating surface LS ranges from 80° to 100° may be less than 80% of the total intensity of the output lights.

As shown in FIG. 3, the emitted directions of the lights generated by the light emitting elements 120 may be various and direct to the illuminating surface LS. When these lights are emitted to the light controller 130 which is in different states (such as the first state SU1 and the second state SU2), the emitted directions of these lights in the light controller 130 may be adjusted and/or filtered by the light controller 130. In detail, first, before the lights enter the light controller 130, a portion of the lights (i.e., the lights L1 of which the angle with the normal direction Dn is greater) may be blocked by a bottom surface of the light shielding element(s) 134, and another portion of the lights may enter the switchable diffuser 132 to be adjusted and/or filtered. In the first state SU1 of this embodiment, the switchable diffusers 132 may not adjust the emitted directions (in the light controller 130) of the lights generated by the light emitting elements 120 (e.g., the switchable diffusers 132 are almost transparent). Therefore, when the lights generated by the light emitting elements 120 enter the switchable diffusers 132 in the first state SU1, the lights (e.g., the lights L2) of which the angle with the normal direction Dn is greater may be blocked by the side walls 134a of the light shielding elements 134, such that the lights may be collimated and pass through the illuminating surface LS (e.g., the lights L3). On the other hand, in the second state SU2 of this embodiment, the switchable diffusers 132 may adjust the emitted directions (in the light controller 130) of the lights generated by the light emitting elements 120 (e.g., the switchable diffusers 132 may make the lights be diffused), and therefore, the lights may be uniformly diffused and pass through the illuminating surface LS (e.g., the lights L4). Accordingly, it can be known that, in the first state SU1 of this embodiment, the light controller 130 may collimate the lights by the light shielding elements 134; in the second state SU2 of this embodiment, the light controller 130 may diffuse the lights by the switchable diffusers 132.

In another aspect, in the light controller 130, the switchable diffuser 132 may have a first haze in the first state SU1, and the switchable diffuser 132 may have a second haze in the second state SU2. Note that, the haze of the object described in the present disclosure represents that the percentage of the intensity of the transmitted lights which deviate from their incident lights by more than 2.5° to the total intensity of the transmitted light. In some embodiments, the first haze may be less than 10, and/or the second haze may be greater than 90, but not limited thereto. As shown in FIG. 4, in order to make the switchable diffuser 132 have different functions (i.e., the haze and/or the ability to change the light path) in different states, the light emitting device 100 may provide an alternating current (AC) control signal with a first voltage difference V1 for the first control electrode E1 and the second control electrode E2 in the first state SU1, and the light emitting device 100 may provide an alternating current control signal with a second voltage difference V2 for the first control electrode E1 and the second control electrode E2 in the second state SU2, wherein the voltage difference of the alternating current control signal represents the maximum voltage difference between the signals of the two electrodes at the same time. In some embodiments, the absolute value of the first voltage difference V1 may be greater than the absolute value of the second voltage difference V2, and/or the second voltage difference V2 may be close to 0, but not limited thereto. In some embodiments, the absolute value of the first voltage difference V1 may be less than the absolute value of the second voltage difference V2, and/or the first voltage difference V1 may be close to 0, but not limited thereto.

According to the above, the switchable diffuser 132 may include any suitable material which can achieve the above function. In some embodiments, each switchable diffuser 132 may be a polymer dispersed liquid crystal cell (PDLC), a polymer network liquid crystal cell (PNLC), other suitable material or a combination thereof. The polymer dispersed liquid crystal cell and the polymer network liquid crystal cell may be respectively mixed with different polymer materials to form different crosslink structures. The thickness of the liquid crystal layer in the polymer network liquid crystal cell is thinner and needs the alignment layer(s); then, since the polymer network liquid crystal cell can be driven by the lower driving voltage, it can save the power. Since the liquid crystal layer in the polymer dispersed liquid crystal cell does not need the alignment layer, its manufacturing cost is lower. Furthermore, the molecules in the switchable diffuser 132 may have different arrangements in the first state SU1 and the second state SU2. For instance, in FIG. 4, the molecules in the switchable diffuser 132 may be substantially parallel to each other in the first state SU1 (the molecules have the similar tilt angle), and the molecules in the switchable diffusers 132 may not have the similar tilt angle in the second state SU2, but not limited thereto. The switchable diffuser 132 may use other type medium based on requirement(s).

In addition, the forming methods of the light controller 130, the first control electrode E1 and the second control electrode E2 are not particularly limited. In some embodiments (as shown in FIG. 2), the first control electrode E1 and the second control electrode E2 may be respectively formed on the insulating layer 150 and the second substrate 140 by a coating process, a deposition process and/or other semiconductor process(es), and the light shielding elements 134 may be formed on the first control electrode E1 by a coating process, a deposition process and/or other semiconductor process(es). Then, the first substrate 110 and the second substrate 140 may be adhered to each other by such as sealant AL, thereby assembling the first substrate 110 and the second substrate 140. Finally, the switchable diffusers 132 may be disposed between the first substrate 110 and the second substrate 140, so as to complete the manufacture, but not limited thereto. Note that, the sealant AL may be used to reduce the leakage of material in the switchable diffuser 132 in addition to assembling the first substrate 110 and the second substrate 140. In some embodiments, the first control electrode E1, the light shielding element 134, the switchable diffuser 132 and the second control electrode E2 may be disposed on the insulating layer 150 in sequence, but not limited thereto.

According to the above, compared with the traditional electronic device with the function of controlling the light direction, the light emitting device 100 of the present disclosure may be thinner, and/or the light emitting device 100 of the present disclosure may have the simplified structure. Moreover, when each light emitting element 120 may be a self-luminous type component, and each light emitting element 120 may generate the light with the intensity corresponding to the gray level signal of the image, the light emitting device 100 may be thinner even and/or may have the more simplified structure.

Moreover, the light emitting device 100 may further include other suitable component(s) and/or structure(s) based requirement(s). In some embodiments, the light emitting device 100 may optionally include an optical layer, such as a polarizer and/or an anti-reflection film, disposed at any suitable position, but not limited thereto. In some embodiments, the light emitting device 100 may optionally include an electrically controlled birefringence (ECB) component disposed on the light controller 130. The electrically controlled birefringence component may be configured to decrease lateral light leakage. Therefore, the electrically controlled birefringence component may make the lights generated by the light emitting device 100 in the first state SU have higher light collimation. For instance, if the light emitting device 100 has the electrically controlled birefringence component, in the lights generated by the light emitting device 100 in the first state SU1, the sum of the intensity of the output lights of which the angle with the illuminating surface LS ranges from 80° to 100° may be enhanced (e.g., this sum may be greater than or equal to 90% of the total intensity of the output lights), but not limited thereto.

The light emitting device of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 5:
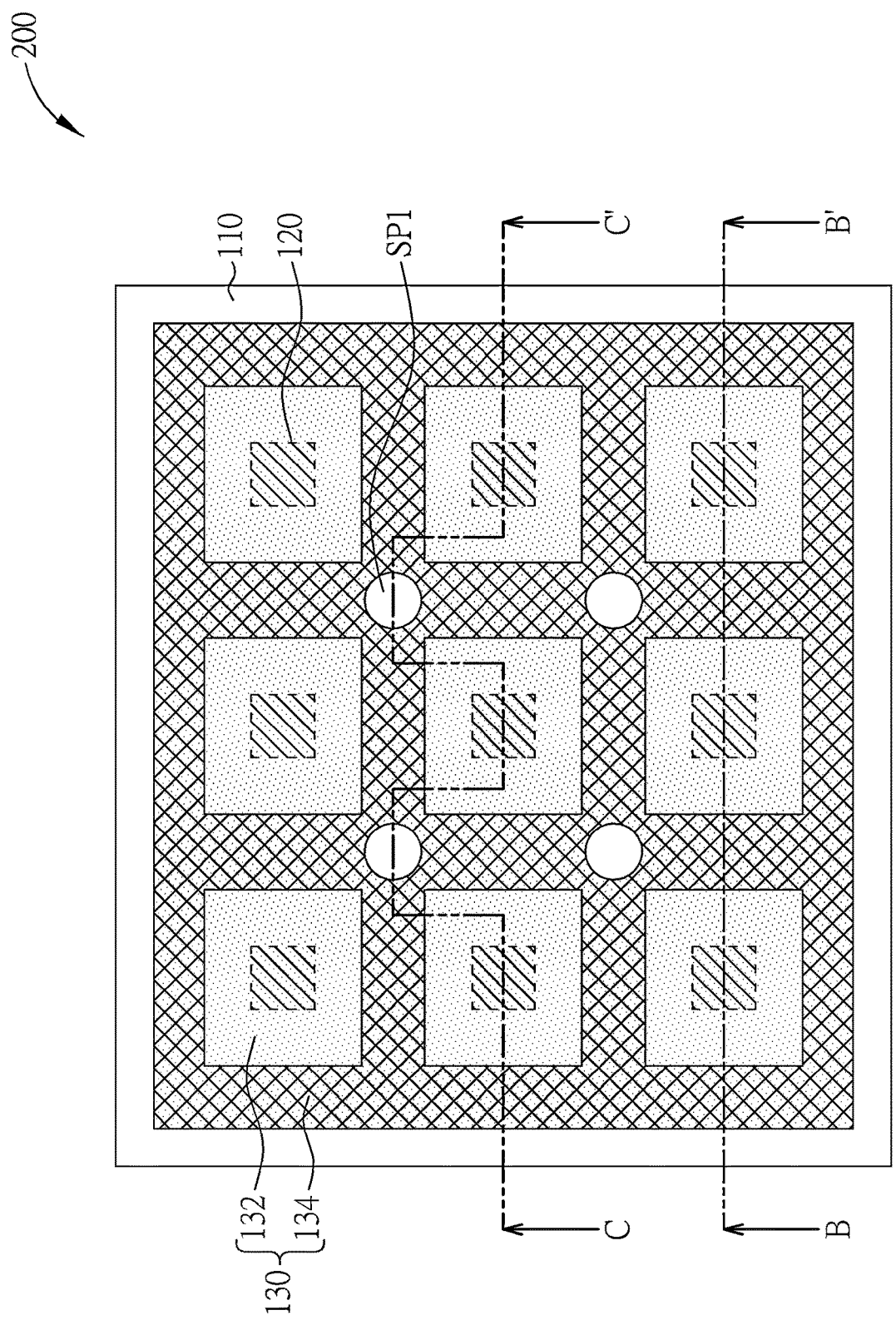
FIG. 5 is a schematic diagram showing a top view of a light emitting device according to a second embodiment of the present disclosure.
Figure 6:
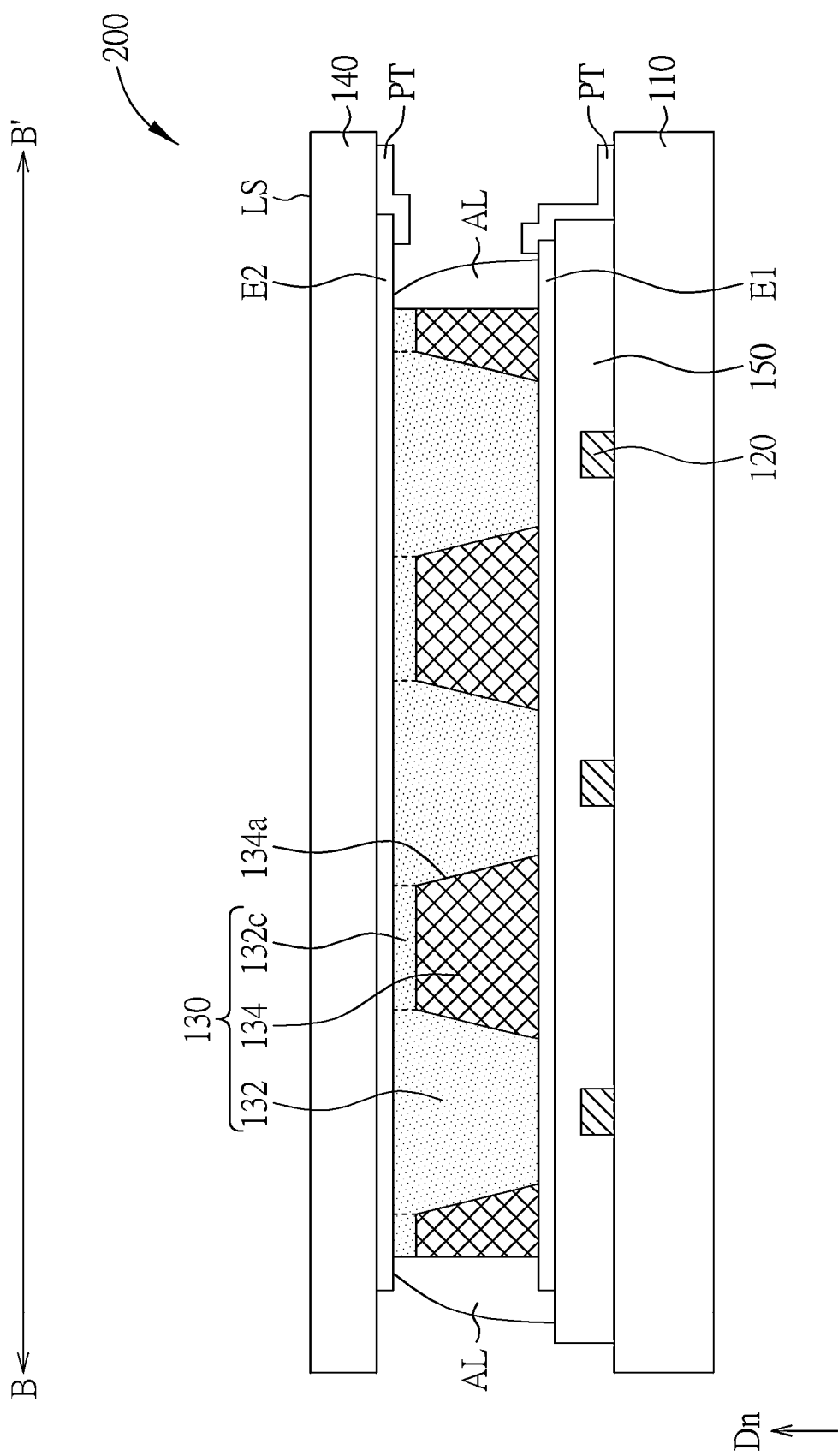
FIG. 6 is a schematic diagram showing a cross-sectional view of the light emitting device taken along a cross-sectional line B-B' in FIG. 5.
Figure 7:
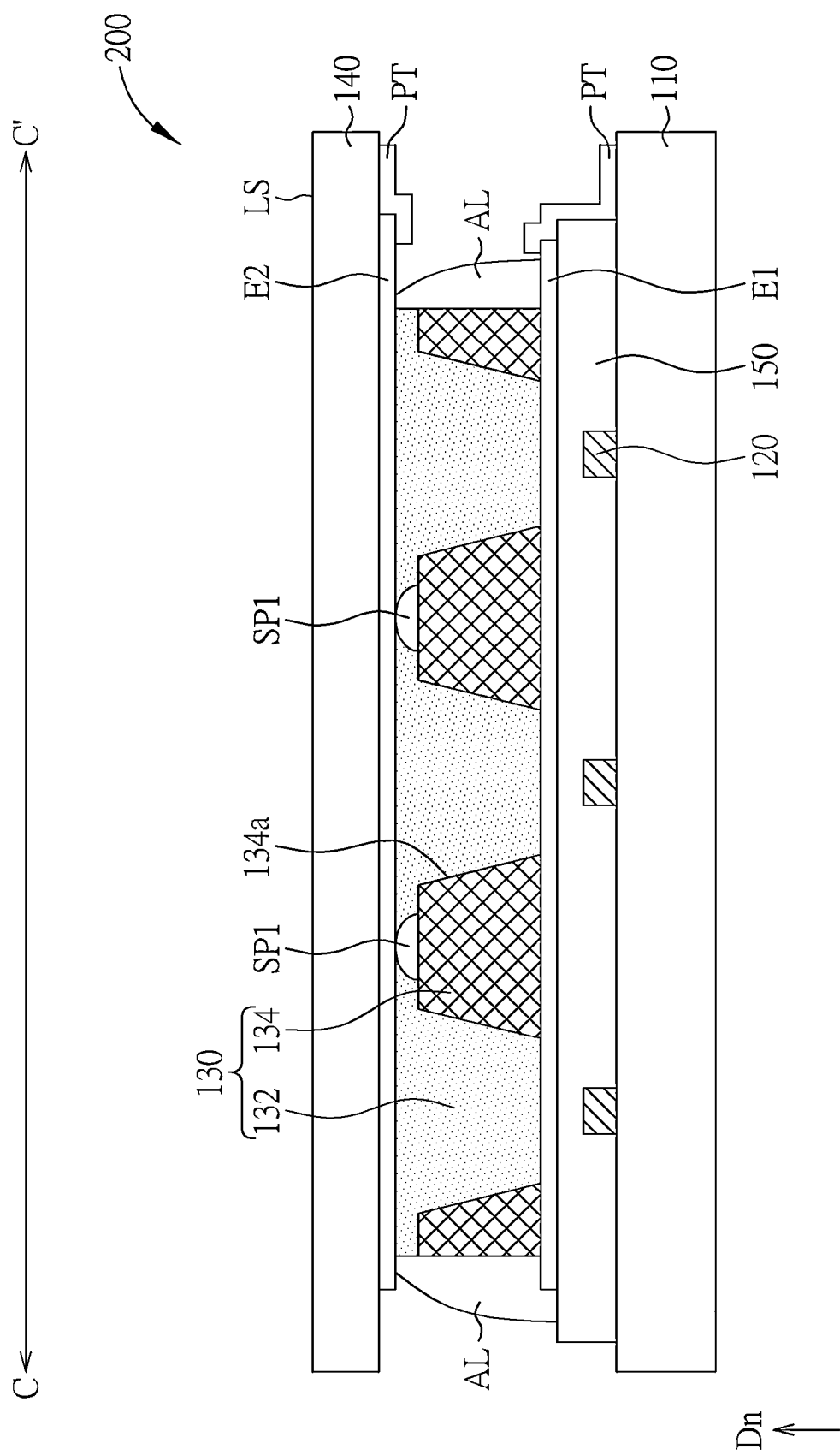
FIG. 7 is a schematic diagram showing a cross-sectional view of the light emitting device taken along a cross-sectional line C-C' in FIG. 5.

Referring to FIG. 5 to FIG. 7, FIG. 5 is a schematic diagram showing a top view of a light emitting device according to a second embodiment of the present disclosure, FIG. 6 is a schematic diagram showing a cross-sectional view of the light emitting device taken along a cross-sectional line B-B' in FIG. 5, and FIG. 7 is a schematic diagram showing a cross-sectional view of the light emitting device taken along a cross-sectional line C-C' in FIG. 5, wherein FIG. 5 only shows nine light emitting elements 120 as an example, but the light emitting device 200 may include fewer or more light emitting elements 120 in fact. Also, the first conductive line and the second conductive line are omitted in FIG. 5 to FIG. 7 to make figures clear. As shown in FIG. 5 to FIG. 7, a difference between this embodiment and the first embodiment is that the light emitting device 200 of this embodiment may further include a plurality of first spacers SP1, and the first spacer SP1 is disposed between the light shielding element 134 and the second control electrode E2. For instance, in FIG. 7, the first spacer SP1 is in contact with the light shielding element 134 and the second control electrode E2 simultaneously, but not limited thereto. The arrangement of the first spacers SP1 in top view, the number of the first spacers SP1 and the density of the first spacers SP1 may be adjusted based on requirement(s). For example, in FIG. 5, in top view, the first spacer SP1 may be disposed at a geometric center of a smallest region containing some light emitting elements 120 (FIG. 5 may be disposed at the geometric center of the smallest rectangle containing four light emitting elements 120), but not limited thereto. Note that the shape of the aforementioned smallest region may be triangle, rectangle, polygon, circle, ellipse or other suitable shape. The material of the first spacer SP1 may include any suitable material, such as photoresist, resin or ink, but not limited thereto. Moreover, as shown in FIG. 6, since the disposition of the first spacer SP1 makes a gap exist between the light shielding elements 134 and the second control electrode E2, the light controller 130 may further include a diffuser connecting part 132c disposed in the gap between the light shielding elements 134 and the second control electrode E2, so as to be connected to two adjacent switchable diffusers 132, wherein the material of the diffuser connecting part 132c may be the same as the material of the switchable diffusers 132.

Figure 8:
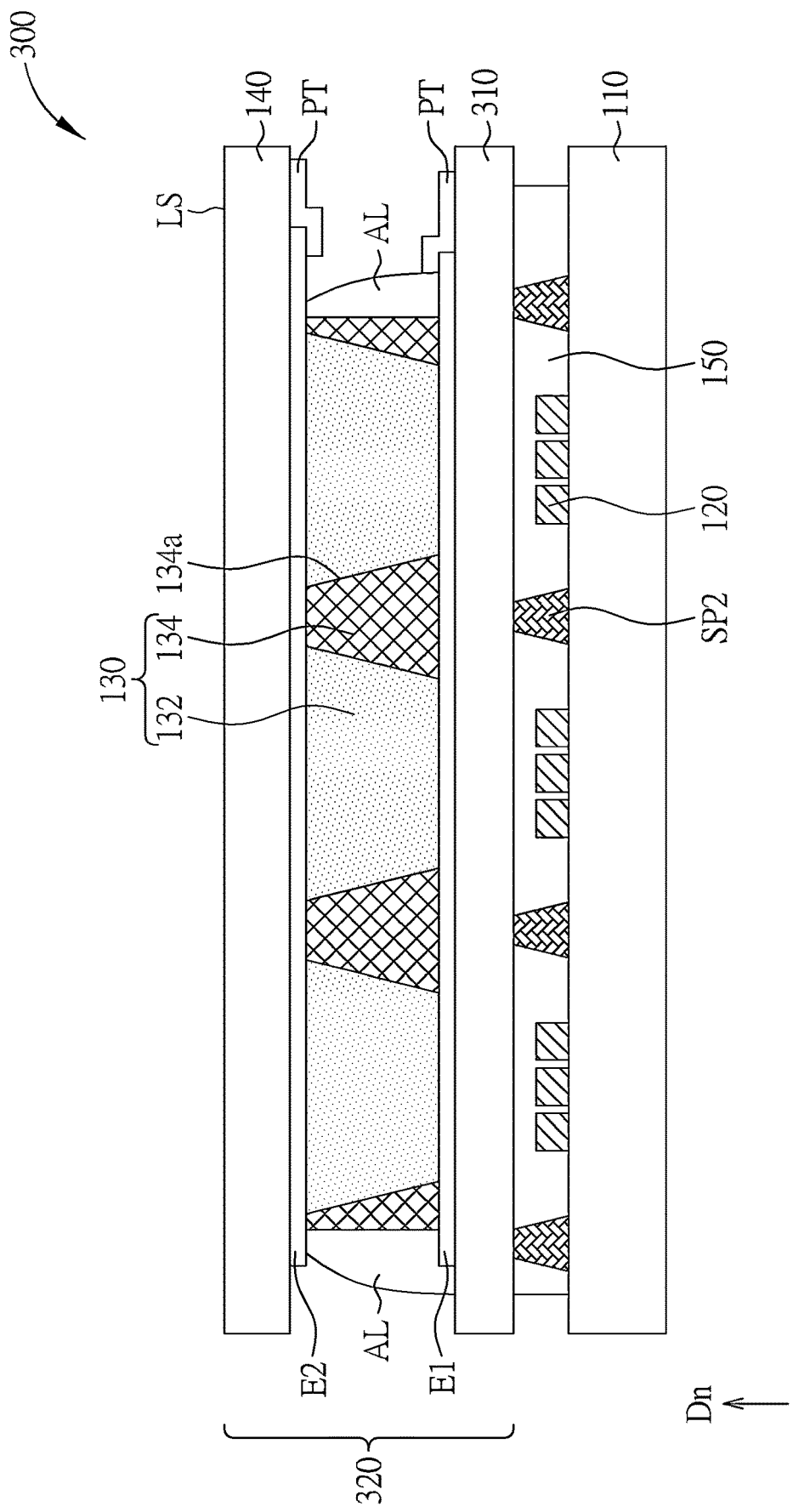
FIG. 8 is a schematic diagram showing a cross-sectional view of a light emitting device according to a third embodiment of the present disclosure.

Referring to FIG. 8, FIG. 8 is a schematic diagram showing a cross-sectional view of a light emitting device according to a third embodiment of the present disclosure, wherein the first conductive line and the second conductive line are omitted in FIG. 8 to make FIG. 8 clear. As shown in FIG. 8, a difference between this embodiment and the first embodiment is that the light emitting device 300 of this embodiment further includes the third substrate 310. The light controller 130, the first control electrode E1 and the second control electrode E2 may be disposed between the second substrate 140 and the third substrate 310, wherein the sealant AL is configured to adhere to the second substrate 140 and the third substrate 310. In the manufacturing method of the light emitting device 300, the formation of the structures and components (e.g., the light controller 130, the first control electrode E1, the second control electrode E2 and the sealant AL, etc.) between the second substrate 140 and the third substrate 310 may be completed first, such that the second substrate 140, the third substrate 310 and the structures and components therebetween form a light controlling board 320. Then, the light controlling board 320 is disposed on the light emitting elements 120 and the insulating layer 150, so as to complete the manufacture of the light emitting device 300. Note that the circuit configured to provide the control signal may be disposed between the second substrate 140 and the third substrate 310, disposed between the first substrate 110 and the third substrate 310 or disposed at other suitable position based on requirement(s), and this circuit may be electrically connected to the first control electrode E1 and the second control electrode E2 through the peripheral traces PT. Furthermore, the third substrate 310 may include glass, quartz, sapphire, polyimide (PI), polyethylene terephthalate (PET), other suitable material or a combination thereof, so as to be a rigid substrate or a flexible substrate.

Moreover, in order to reduce the damage on the light emitting elements 120 when the light controlling board 320 is disposed on the light emitting elements 120 and the insulating layer 150 (e.g., the damage on the light emitting elements 120 is caused by the pressure which the light controlling board 320 is disposed on the light emitting elements 120), the light emitting device 300 may optionally include a second spacer SP2 disposed on the first substrate 110, wherein the top of the second spacer SP2 may be higher than the light emitting element 120. The insulating layer 150 may cover the top of the second spacer SP2, or the top of the second spacer SP2 is higher than or equal to the top surface of the insulating layer 150. For instance, in FIG. 8, the second spacer SP2 may be in contact with the third substrate 310, but not limited thereto. The second spacer SP2 may include any suitable material, such as photoresist, resin or ink, but not limited thereto. In addition, due to the disposition of the second spacer SP2, in the lights emitted by the light emitting elements 120, the lights having a larger angle with the normal direction Dn may be blocked, thereby making the lights emitted by the light emitting elements 120 more concentrated.

Furthermore, each switchable diffuser 132 may be corresponding to (or overlapped with) one or more of the light emitting elements 120 in the normal direction Dn. For instance, each switchable diffuser 132 shown in FIG. 8 may be corresponding to (or overlapped with) three light emitting elements 120 in the normal direction Dn, and these three light emitting elements 120 may emit the lights with the same color or different colors. In some embodiments, each switchable diffuser 132 may be corresponding to (or overlapped with) three light emitting elements 120 respectively emitting red light, green light and blue light in the normal direction Dn, but not limited thereto.

Figure 9:
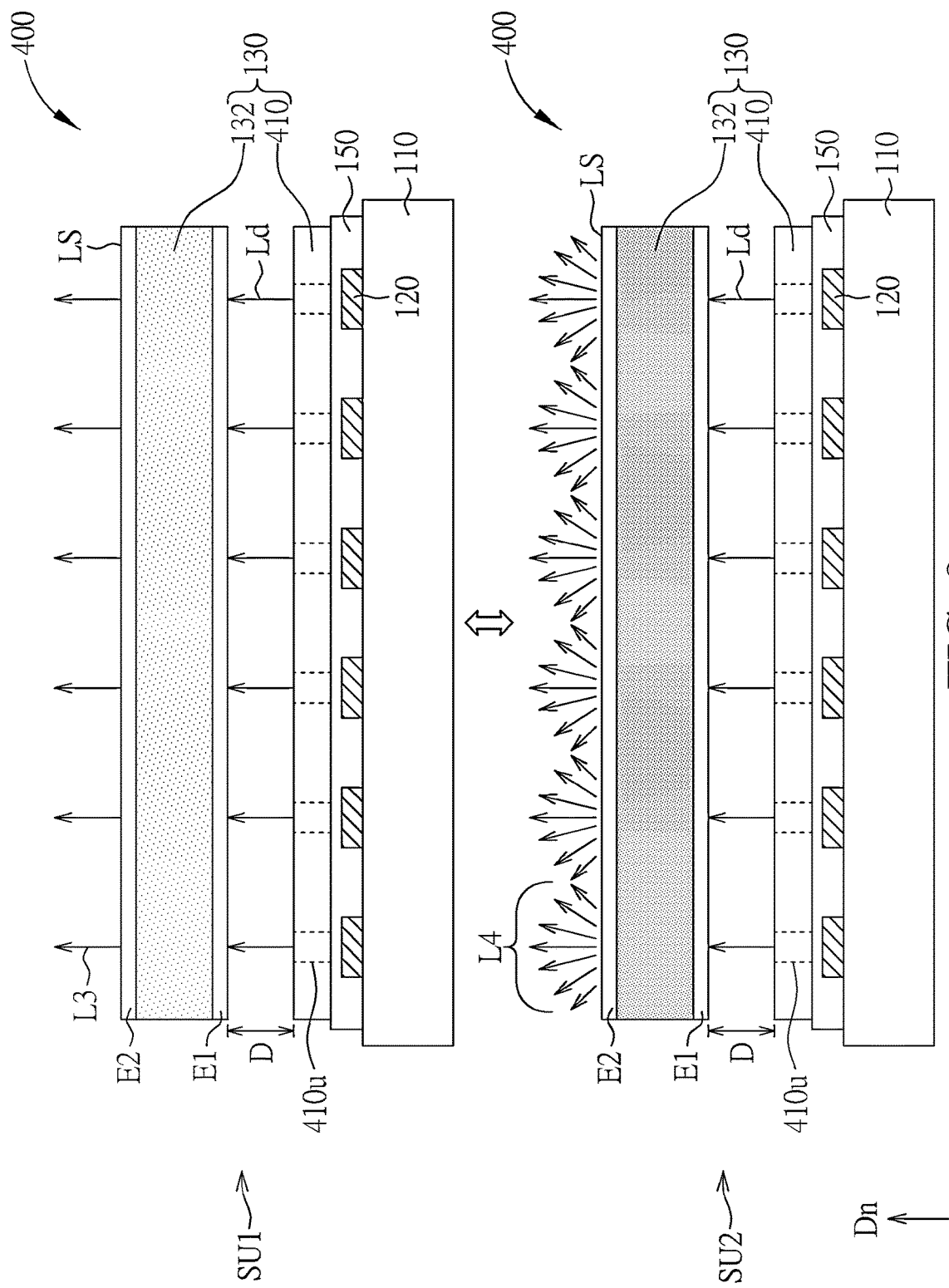
FIG. 9 is a schematic diagram showing a cross-sectional view of a structure and lights of a light emitting device in a first state and a structure and lights of a light emitting device in a second state according to a fourth embodiment of the present disclosure.

Referring to FIG. 9, FIG. 9 is a schematic diagram showing a cross-sectional view of a structure and lights of a light emitting device in a first state and a structure and lights of a light emitting device in a second state according to a fourth embodiment of the present disclosure, wherein the first conductive line and the second conductive line are omitted in FIG. 9 to make FIG. 9 clear. Note that FIG. 9 uses different shadings to show the switchable diffusers 132 in different states, wherein the switchable diffusers 132 in the first state SU1 are shown by sparsely dotted shading, and the switchable diffusers 132 in the second state SU2 are shown by densely dotted shading. As shown in FIG. 9, a difference between this embodiment and the first embodiment is the design of the light controller 130 of the light emitting device 400 of this embodiment. In this embodiment, the light controller 130 may include two layers, one of the layers is a collimator 410, and the other layer is the switchable diffuser (s) 132 disposed on the collimator 410. The collimator 410 may include a plurality of collimating units 410u, and each collimating unit 410u may be corresponding to one or more of the light emitting elements 120 and configured to make the lights generated by the corresponding light emitting element(s) 120 be collimated, thereby forming the collimated lights Ld. The material and operation of switchable diffuser 132 may be similar to the first embodiment, wherein the switchable diffuser 132 may be controlled based on the control signals received by the first control electrode E1 and the second control electrode E2, such that the light controller 130 may be switchable in the first state SU1 and the second state SU2.

In the first state SU1 of this embodiment, the switchable diffusers 132 may not adjust the emitted directions (in the light controller 130) of the collimated lights Ld (e.g., the switchable diffuser 132 is almost transparent). Therefore, when the collimated lights Ld enter the switchable diffuser 132 in the first state SU1, the collimated lights Ld may directly pass through the illuminating surface LS (e.g., the lights L3). On the other hand, in the second state SU2 of this embodiment, the switchable diffusers 132 may adjust the emitted directions (in the light controller 130) of the collimated lights Ld (e.g., the switchable diffuser 132 may make the lights be diffused), and therefore, the illuminating surface LS may emit uniformly diffused lights (e.g., the lights L4). Accordingly, it can be known that, the light controller 130 may adjust the collimated lights Ld to make the collimated lights Ld be diffused by the switchable diffuser 132 in the second state SU2. Note that, in FIG. 9, the illuminating surface LS may be an outer surface of the second control electrode E2 or an outer surface of other layer disposed on the switchable diffuser 132.

Optionally, in the light controller 130, the collimator 410 and the switchable diffuser 132 are spaced apart from each other by a distance D in the normal direction Dn, and this distance D may not be greater than 0.35 mm, but not limited thereto. Owing to the existence of this distance D, the switchable diffuser 132 of the light controller 130 makes the collimated lights Ld be diffused more uniformly. In addition, for example, in some embodiments, a space between the collimator 410 and the switchable diffuser 132 may be filled with any suitable transparent material, wherein the transparent material may include such as acrylic resin, epoxy resin and/or silicon resin, but not limited thereto.

Figure 10:
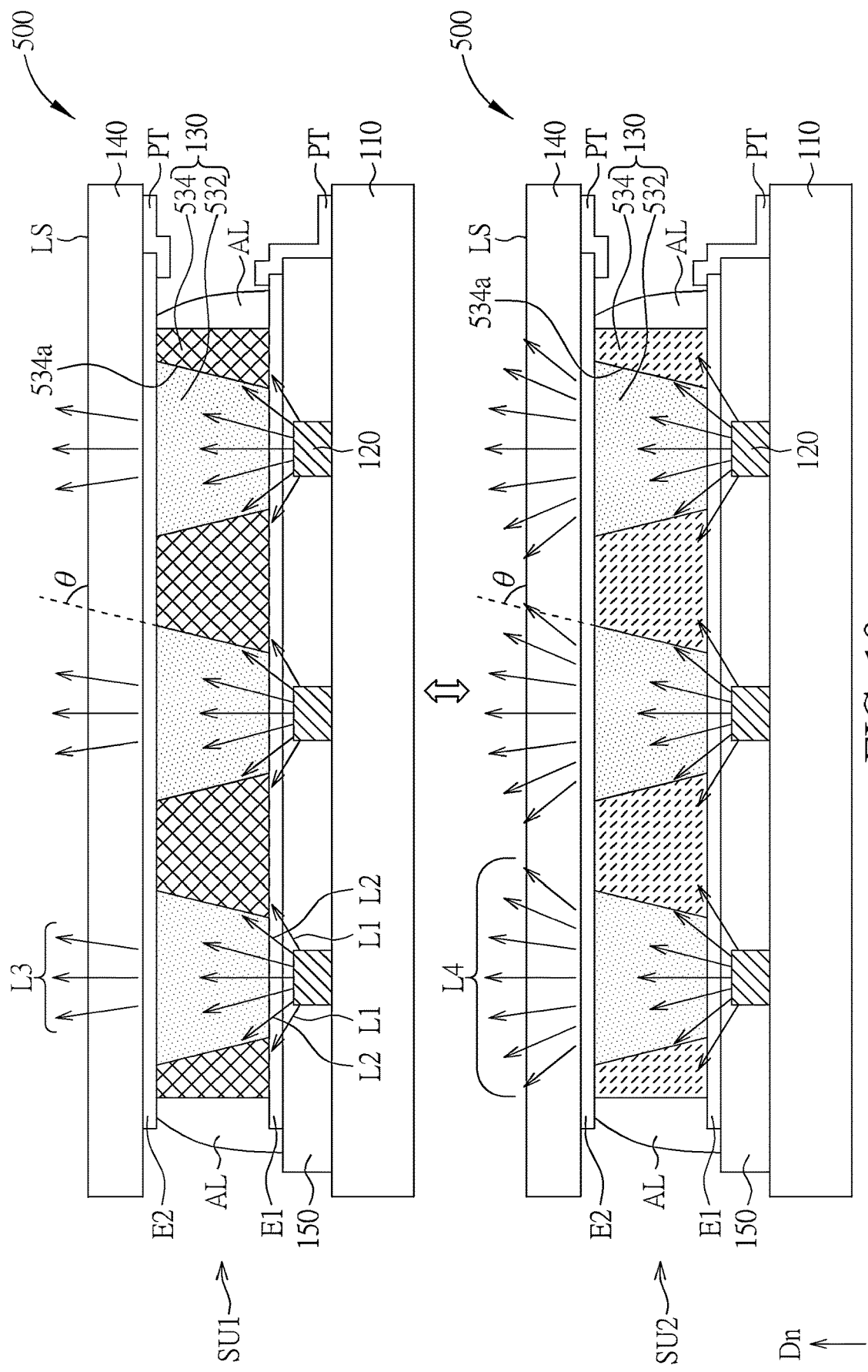
FIG. 10 is a schematic diagram showing a cross-sectional view of a structure and lights of a light emitting device in a first state and a structure and lights of a light emitting device in a second state according to a fifth embodiment of the present disclosure.

Referring to FIG. 10, FIG. 10 is a schematic diagram showing a cross-sectional view of a structure and lights of a light emitting device in a first state and a structure and lights of a light emitting device in a second state according to a fifth embodiment of the present disclosure, wherein the first conductive line and the second conductive line are omitted in FIG. 10 to make FIG. 10 clear. As shown in FIG. 10, a difference between this embodiment and the first embodiment is the design of the light controller 130 of the light emitting device 500 of this embodiment. The light controller 130 of this embodiment include a plurality of the units 532 and a plurality of walls 534, wherein the disposed positions of the units 532 may be similar to the switchable diffusers of the first embodiment, the walls 534 may be similar to the light shielding elements of the above embodiment, and the disposed positions of the walls 534 may be similar to the disposed positions of the light shielding elements of the above embodiment. Accordingly, each of the units 532 may be corresponding to (or overlapped with) at least one of the light emitting elements 120 in the normal direction Dn, the walls 534 may be disposed between two adjacent units 532, and the walls 534 may not be corresponding to (or not overlapped with) the light emitting element 120 in the normal direction Dn. For instance, in FIG. 10, one of the units 532 may be corresponding to (or overlapped with) one light emitting element 120 in the normal direction Dn, but not limited thereto. The disposed positions of the units 532 and the walls 534 of the light controller 130 may be designed based on requirement(s). For example, in some embodiments (as shown in FIG. 10), the wall (s) 534 may surround one unit 532 in top view, and/or two adjacent units 532 may be completely separated by the wall (s) 534, but not limited thereto. Furthermore, an angle θ between a side wall 534a of the wall 534 and the illuminating surface LS may be greater than or equal to 80°, for example, but not limited thereto. The side wall 534a may substantially extend along an extending direction and may not be a flatten surface, and the angle θ may be between this extending direction and the illuminating surface LS.

In this embodiment, the units 532 of the light controller 130 may be transparent (or almost transparent), such that the lights generated by the light emitting elements 120 may pass through these units 532. The walls 534 may be controlled based on the control signals received by the first control electrode E1 and the second control electrode E2, such that the light controller 130 may be switchable in the first state SU and the second state SU2, wherein the light controller 130 may collimate the lights generated by the light emitting elements 120 in the first state SU1 and may diffuse the lights generated by the light emitting elements 120 in the second state SU2. Specifically, when the light controller 130 is in the first state SU1, the walls 534 may be in a non-transmissive state; when the light controller 130 is in the second state SU2, the walls 534 may be in a transmissive state. Namely, the walls 534 may be switchable in states of the transmissive state and the non-transmissive state. In order to make the walls 534 be switchable in the transmissive state and the non-transmissive state, the first control electrode E1 and the second control electrode E2 may be disposed adjacent to the walls 534 of the light controller 130 at least, and the light emitting device 500 may be switchable in the first state SU1 and the second state SU2 by providing different control signals for the first control electrode E1 and the second control electrode E2. Note that FIG. 10 uses different shadings to show the walls 534 in different states, wherein the walls 534 in the non-transmissive state (the light controller 130 is in the first state SU1) are shown by the shading with grids, and the walls 534 in the transmissive state (the light controller 130 is in the second state SU2) are shown by the shading with non-continuous tilt lines.

In detail, in the first state SU1 of this embodiment (as shown in FIG. 10), the walls 534 are in the non-transmissive state. Hence, before the lights generated by the light emitting elements 120 enter the light controller 130, a portion of the lights (i.e., the lights L1 of which the angle with the normal direction Dn is greater) may be blocked by the bottom surface of the walls 534, and another portion of the lights may enter the units 532 which are transparent, thereby filtering the lights. Then, since the units 532 may not adjust the emitted directions of the lights generated by the light emitting elements 120, and the walls 534 are in the non-transmissive state, when the lights generated by the light emitting elements 120 enter the unit 532, the lights (e.g., the lights L2) of which the angle with the normal direction Dn is greater may be blocked by the side walls 534a of the walls 534 in the non-transmissive state, such that the lights may be collimated and pass through the illuminating surface LS (e.g., the lights L3). On the other hand, in the second state SU2 of this embodiment (as shown in FIG. 10), the walls 534 are in the transmissive state (e.g., the walls 534 are transparent or almost transparent). Hence, the emitted directions of the lights generated by the light emitting elements 120 (the emitted directions of the lights are various and direct to the illuminating surface LS) may not be adjusted and/or filtered by the light controller 130 substantially. As the result, the lights may be diffused and pass through the illuminating surface LS (e.g., the lights L4). Accordingly, it can be known that, in the first state SU1 of this embodiment, the light controller 130 may collimate the lights by the walls 534; in the second state SU2 of this embodiment, the light controller 130 may not adjust and/or filter the lights generated by the light emitting elements 120 substantially, so as to make the lights diffused.

Accordingly, the wall 534 and the units 532 may individually include any suitable material which can achieve the above function. In some embodiments, the refractive index of the unit 532 may range such as from 1.4 to 1.9, but not limited thereto. In some embodiments, the unit 532 may include acrylic resin, polycarbonate resin, silicon resin, epoxy resin, other suitable transparent material or a combination thereof, but not limited thereto. In some embodiments, the wall 534 may be made of an electrochromic material or suspend particles, but not limited thereto.

In addition, in this embodiment, the forming methods of the light controller 130, the first control electrode E1 and the second control electrode E2 are not particularly limited. In some embodiments, the first control electrode E1 and the second control electrode E2 may be respectively formed on the insulating layer 150 and the second substrate 140 by a coating process, a deposition process and/or other semiconductor process(es), and the walls 534 and the units 532 may be formed on the first control electrode E1 or the second control electrode E2. Then, the first substrate 110 and the second substrate 140 may be adhered to each other by such as the sealant AL, thereby assembling the first substrate 110 and the second substrate 140 to complete the manufacture, but not limited thereto.

Figure 11:
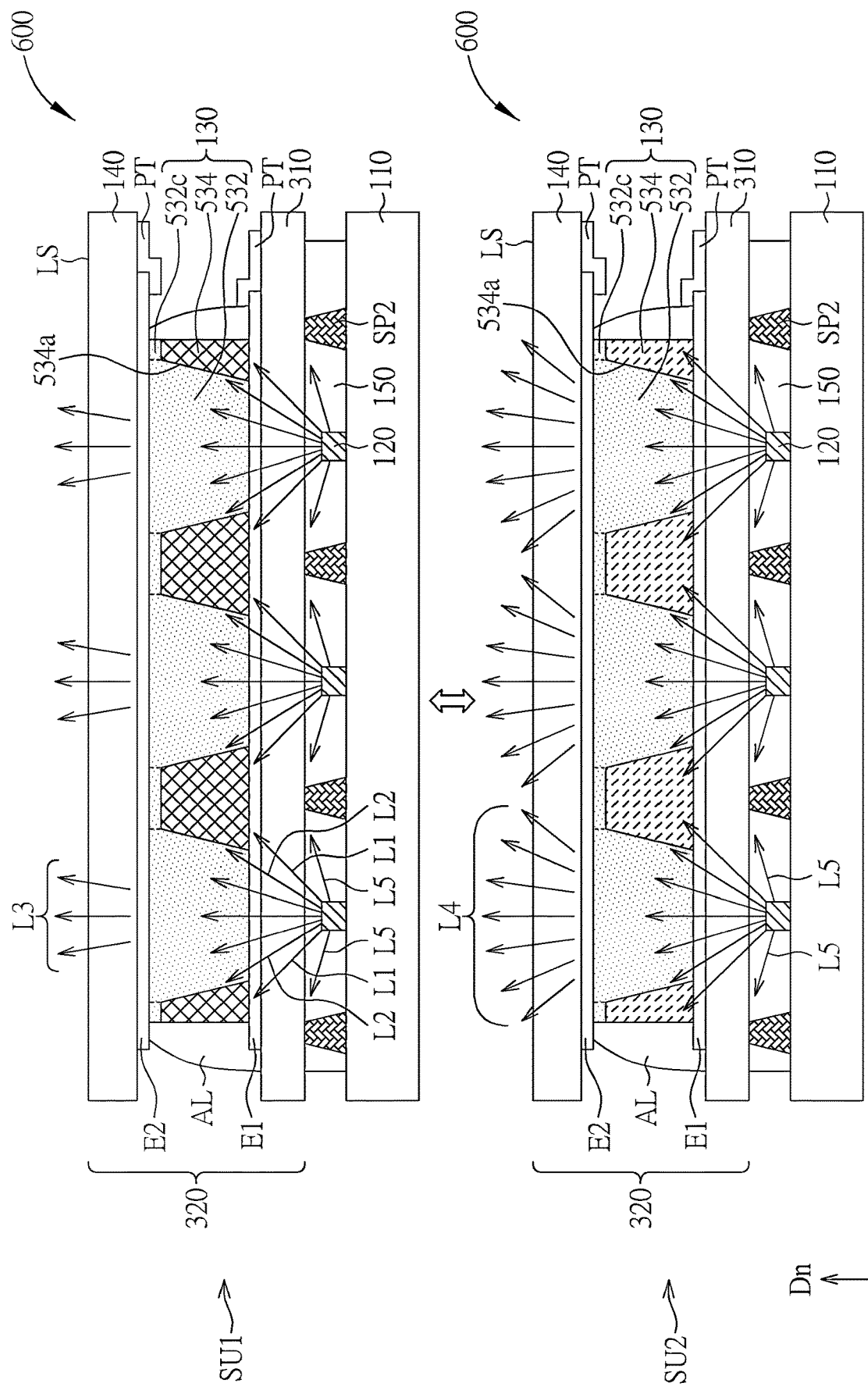
FIG. 11 is a schematic diagram showing a cross-sectional view of a structure and lights of a light emitting device in a first state and a structure and lights of a light emitting device in a second state according to a sixth embodiment of the present disclosure.

Referring to FIG. 11, FIG. 11 is a schematic diagram showing a cross-sectional view of a structure and lights of a light emitting device in a first state and a structure and lights of a light emitting device in a second state according to a sixth embodiment of the present disclosure, wherein the first conductive line and the second conductive line are omitted in FIG. 11 to make FIG. 11 clear. Note that FIG. 11 uses different shadings to show the walls 534 in different states, wherein the walls 534 in the first state SU1 are shown by the shading with grids, and the walls 534 in the second state SU2 are shown by the shading with non-continuous tilt lines. As shown in FIG. 11, a difference between this embodiment and the fifth embodiment is that the light emitting device 600 of this embodiment further includes a third substrate 310. The light controller 130, the first control electrode E1 and the second control electrode E2 are disposed between the second substrate 140 and the third substrate 310, wherein the sealant AL is configured to adhere to the second substrate 140 and the third substrate 310, such that the second substrate 140, the third substrate 310 and the structures and components therebetween form a light controlling board 320. The details of the third substrate 310 and the light controlling board 320 may be referred to the third embodiment of the present disclosure, and these will not be redundantly described. Similarly, in order to reduce the damage on the light emitting elements 120 when the light controlling board 320 is disposed on the light emitting elements 120 and the insulating layer 150 (e.g., the damage on the light emitting elements 120 is caused by the pressure which the light controlling board 320 is disposed on the light emitting elements 120), the light emitting device 600 may optionally include a second spacer SP2 disposed on the first substrate 110, wherein the top of the second spacer SP2 is higher than the light emitting elements 120. The details of the second spacer SP2 may be referred to the third embodiment of the present disclosure, and these will not be redundantly described. Furthermore, due to the disposition of the second spacer SP2, in the lights emitted by the light emitting elements 120, the lights (e.g., the lights L5) having a larger angle with the normal direction Dn may be blocked, thereby making the lights emitted by the light emitting elements 120 more concentrated.

Moreover, in FIG. 11, since a gap exists between the walls 534 and the second control electrode E2, the light controller 130 may further include an unit connecting part 532c disposed in the gap between the walls 534 and the second control electrode E2, so as to be connected to two adjacent units 532, wherein the material of the unit connecting part 532c may be the same as the material of the units 532. Furthermore, similar to the second embodiment of the present disclosure, the light emitting device may further include a first spacer disposed between the wall 534 and the second control electrode E2, so as to generate the above gap. The details of the first spacer may be referred to the second embodiment of the present disclosure, and these will not be redundantly described.

In summary, the light emitting device of the present disclosure may control or adjust the light direction emitted from the illuminating surface by the light controller, thereby enhancing the privacy of viewing and/or preventing specific persons from viewing. Furthermore, compared with the traditional electronic device with the function of controlling the light direction, the light emitting device of the present disclosure may be thinner, and/or the light emitting device of the present disclosure may have the simplified structure.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device, comprising:
a plurality of light emitting elements for emitting lights; and
a light controller disposed on the plurality of light emitting elements for the lights passing through to form output lights;
wherein the light controller comprises a first optical element, a second optical element and a transparent element disposed between the first optical element and the second optical element, and a thickness of the transparent element is not greater than 0.35 mm;
wherein the second optical element comprises a plurality of switchable diffusers disposed corresponding to the plurality of light emitting elements and a plurality of light shielding elements surrounding the switchable diffusers.

2. The light emitting device according to claim 1, wherein the light controller is configured to adjust the lights by switching in a first state and a second state.

3. The light emitting device according to claim 2, wherein a sum of an intensity of the output lights in the first state is greater than a sum of an intensity of the output lights in the second state in an angle ranged from 80° to 100°.

4. The light emitting device according to claim 2, wherein a sum of an intensity of the output lights in the second state in an angle ranged from 80° to 100° is less than 80% of a total intensity of the output lights in the second state.

5. The light emitting device according to claim 1, wherein the first optical element is disposed between the second optical element and the plurality of light emitting elements.

6. The light emitting device according to claim 5, wherein the second optical element is controlled by a first electrode and a second electrode.

7. The light emitting device according to claim 6, wherein the first electrode and the second electrode comprise a transparent conductive material.

8. The light emitting device according to claim 7, wherein the first electrode and the second electrode comprise indium tin oxide.

9. The light emitting device according to claim 6, wherein at least one of the first electrode and the second electrode is patterned.

10. The light emitting device according to claim 6, wherein the second optical element comprises liquid crystal molecules.

11. The light emitting device according to claim 1, wherein the transparent element comprises an organic material.

12. The light emitting device according to claim 11, wherein the transparent element comprises acrylic resin.

13. The light emitting device according to claim 11, wherein the transparent element comprises epoxy resin.

14. The light emitting device according to claim 11, wherein the transparent element comprises silicon resin.

15. The light emitting device according to claim 1, further comprising a substrate on which the plurality of light emitting elements are disposed, wherein the first optical element, the second optical element and the transparent element are overlapped with each other in a normal direction of the substrate.

* * * * *